(12) United States Patent
Kim

(10) Patent No.: US 8,737,140 B2
(45) Date of Patent: May 27, 2014

(54) SEMICONDUCTOR MEMORY DEVICE AND METHOD OF OPERATING THE SAME

(75) Inventor: Tae Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 61 days.

(21) Appl. No.: 13/614,382

(22) Filed: Sep. 13, 2012

(65) Prior Publication Data

US 2013/0250698 A1 Sep. 26, 2013

(30) Foreign Application Priority Data

Sep. 28, 2011 (KR) .................... 10-2011-0098592

(51) Int. Cl.
*G11C 11/34* (2006.01)
*G11C 16/26* (2006.01)
*G11C 11/56* (2006.01)

(52) U.S. Cl.
CPC ............ *G11C 16/26* (2013.01); *G11C 11/5628* (2013.01)
USPC .................................. 365/185.25; 385/185.24

(58) Field of Classification Search
CPC .............................. G11C 6/26; G11C 11/5628
USPC ........................................ 365/185.25, 185.24
See application file for complete search history.

(56) References Cited

U.S. PATENT DOCUMENTS

| 7,684,237 | B2 * | 3/2010 | Moschiano et al. | ..... 365/185.02 |
| 2009/0273979 | A1 * | 11/2009 | Aritome | ................... 365/185.17 |
| 2010/0091576 | A1 * | 4/2010 | Kwon et al. | ............. 365/185.25 |
| 2010/0135075 | A1 * | 6/2010 | Moschiano et al. | ..... 365/185.02 |

FOREIGN PATENT DOCUMENTS

| KR | 10-0961196 B | 5/2010 |
| KR | 10-2011-0078731 A | 7/2011 |

* cited by examiner

*Primary Examiner* — Michael Tran
(74) *Attorney, Agent, or Firm* — William Park & Associates Patent Ltd.

(57) ABSTRACT

A semiconductor memory device includes strings configured to include a drain select transistor, memory cells, and a source select transistor coupled in series between a bit line and a common source line and peripheral circuits configured to precharge a bit line so that the precharge level of the bit line varies depending on whether an adjacent unselected memory cell is in the program or erase states, by supplying a first voltage to the adjacent unselected memory cell arranged toward the drain select transistor, a second voltage to the remaining memory cells, and a third voltage higher than a bit line precharge voltage to the common source line and perform a read operation of supplying a read voltage lower than the second voltage to the selected memory cell, the second voltage to the remaining memory cells including the adjacent unselected memory cell, and a ground voltage to the common source line.

20 Claims, 7 Drawing Sheets

Conventional VT distribution

VT distribution of this disclosure

SEMICONDUCTOR MEMORY DEVICE AND METHOD OF OPERATING THE SAME

CROSS-REFERENCE TO RELATED APPLICATION

Priority is claimed to Korean patent application number 10-2011-0098592 filed on Sep. 28, 2011, the entire disclosure of which is incorporated by reference herein.

BACKGROUND

An embodiment of this invention relates generally to a semiconductor memory device and a method of operating the same and more particularly to a semiconductor memory device including memory cell blocks and a method of operating the same.

The memory cell array of semiconductor memory device such as a NAND flash memory device includes a plurality of memory cell blocks. Each of the memory cell blocks includes memory cells coupled to a plurality of word lines arranged between a drain select line and a source select line.

In order to store data in the memory cells, a program operation is sequentially performed from memory cells coupled to the first word line adjacent to the source select line, to memory cells coupled to the last word line adjacent to the drain select line. In this case, when the program operation is performed on memory cells coupled to a next word line after the program operation is performed on memory cells coupled to a previous word line, the threshold voltages of the memory cells coupled to the previous word line are shifted because the memory cells coupled to the previous word line are subject to a program interference phenomenon due to the program operation performed on memory cells coupled to a next word line. For this reason, data stored in the memory cells may be altered.

The program interference phenomenon becomes severe as the size of the memory cell is reduced or an interval between the word lines is narrowed with the efforts to highly integrate the semiconductor devices. Furthermore, a multi-level cell (MLC) in a NAND memory device in which data of multiple bits is stored in one memory cell, the threshold voltages of memory cells are shifted more severely owing to the program interference phenomenon, and thus data stored in the memory cells may be easily altered.

When a program operation is performed on memory cells coupled to a next word line, a program interference phenomenon generated in memory cells coupled to a previous word line needs to be inhibited or offset.

Several program operations of inhibiting the program interference phenomenon are being proposed. It is, however, difficult to inhibit the program interference phenomenon generated in the memory cells coupled to the previous word line because a program operation is performed on the memory cells coupled to the next word line after the program operation is performed on the memory cells coupled to the previous word line.

BRIEF SUMMARY

An exemplary embodiment relates to a semiconductor memory device and a method of operating the same, which are capable of outputting data by compensating for a shift in the threshold voltage levels of memory cells due to a program interference phenomenon that is generated when a program operation is performed in order to store data.

A semiconductor memory device according to an embodiment of the present invention includes a plurality of strings each configured to include a drain select transistor, memory cells, and a source select transistor coupled in series between a bit line and a common source line and peripheral circuits configured to perform an operation of precharging a bit line so that a precharge level of the bit line is changed depending on a program state or an erase state of an unselected and adjacent memory cell by supplying a first voltage to the unselected and adjacent memory cell adjacent to a memory cell, selected from among the memory cells, toward the drain select transistor, a second voltage to the remaining memory cells in order to turn on the remaining memory cells, and a third voltage higher than a bit line precharge voltage to the common source line and to perform a read operation of supplying a read voltage lower than the second voltage to the selected memory cell, the second voltage to the remaining unselected memory cells including the unselected and adjacent memory cell, and a ground voltage to the common source line.

A method of operating a semiconductor memory device according to an embodiment of the present invention includes performing an operation of precharging a bit line so that a precharge level of the bit line is changed depending on a program state or an erase state of an unselected and adjacent memory cell by supplying a first voltage to the unselected and adjacent memory cell adjacent to a selected memory cell toward a drain select transistor, a second voltage to the remaining memory cells including the selected memory cell in order to turn on the remaining memory cells, and a third voltage higher than a bit line precharge voltage to a common source line and performing a read operation of supplying a read voltage lower than the second voltage to the selected memory cell, the second voltage to the remaining unselected memory cells including the unselected and adjacent memory cell, and a ground voltage to the common source line.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
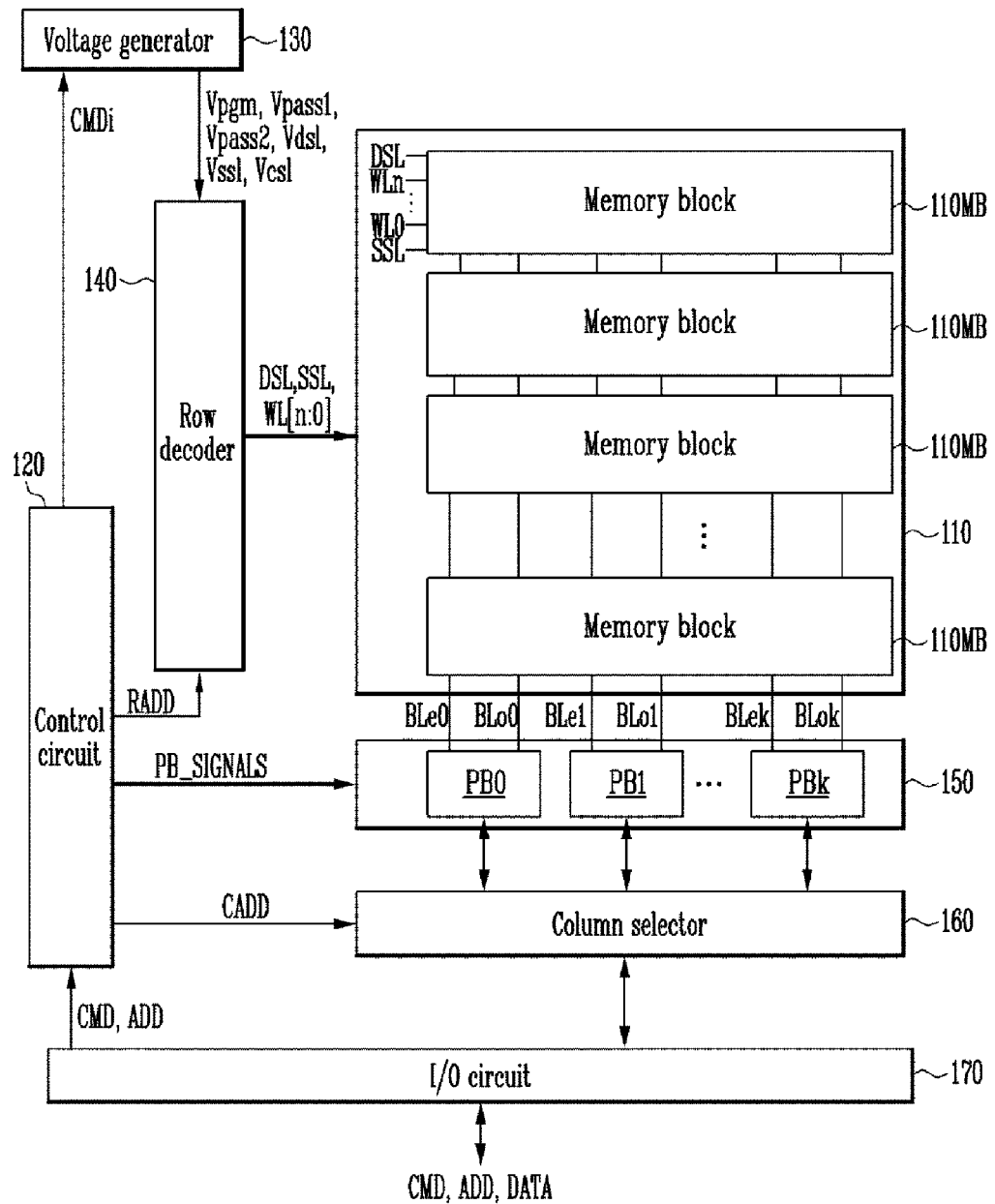
FIG. 1 is a circuit diagram of a semiconductor memory device according to an exemplary embodiment of the present invention.
Figure 2:
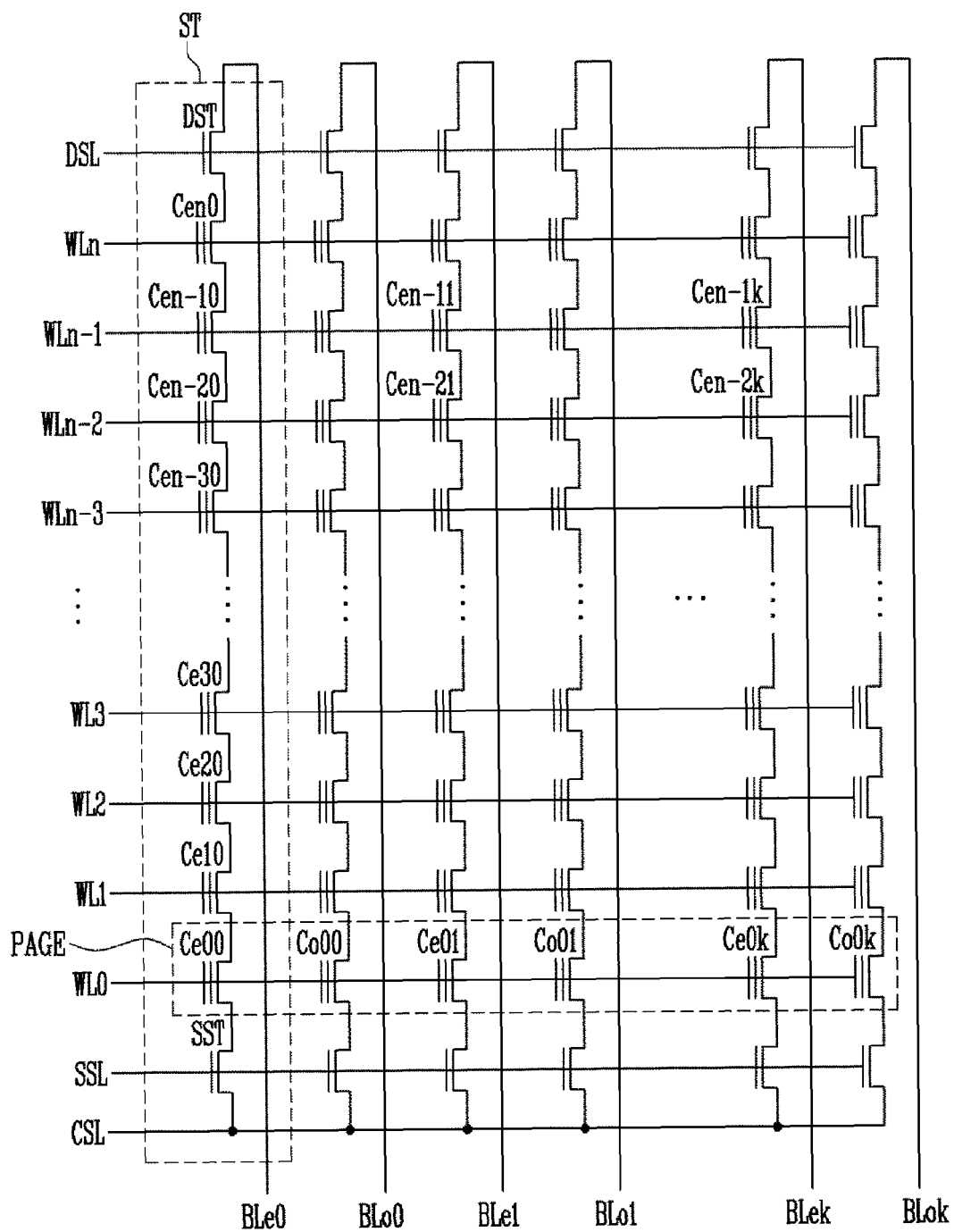
FIG. 2 is a circuit diagram of a memory cell block shown in FIG. 1.

FIG. 1 is a circuit diagram of a semiconductor memory device according to an exemplary embodiment of the present invention. FIG. 2 is a circuit diagram of a memory cell block shown in FIG. 1.

The semiconductor memory device according to an exemplary embodiment of the present invention includes a memory array 110, including a plurality of memory cell blocks 110MB, and peripheral circuits.

All the memory cell blocks 110MB of the memory array 110 may have the same configuration. Thus, the configuration of only one of the memory cell blocks 110MB is described below.

Referring to FIG. 2, the memory cell block 110MB includes a plurality of strings coupled between bit lines BLe0, BLe1, . . . , BLek and BLo0, BLo1, . . . , BLok and a common source line CSL. That is, each of the strings is coupled to one of the bit lines BLe0, BLe1, . . . , BLek and BLo0, BLo1, . . . , BLok and in common coupled to the common source line CSL. Each of the strings ST, for example, a string ST includes a source select transistor SST having a source coupled to the common source line CSL, a plurality of memory cells Ce00, Ce10, . . . , Cen0, and a drain select transistor DST having a drain coupled to a bit line (for example, BLe0). The memory cells Ce00, Ce10, . . . , Cen0 are coupled in series between the source and drain select transistors SST and DST. The gate of the source select transistor SST is coupled to a source select line SSL, the gates of the memory cells Ce00, Ce10, . . . , Cen0 are coupled to respective word lines WL0, WL1, . . . , WLn, and the gate of the drain select transistor DST is coupled to a drain select line DSL.

In a semiconductor memory device such as a NAND flash memory device, the page where data are stored may be divided into a physical page and a logical page. For example, the memory cells Ce00, Ce01, . . . , Ce0$k$ or Co00, Co01, . . . , Co0k coupled to a word line (for example, WL0) may form a physical page PAGE. For example, the even-numbered memory cells Ce00, Ce01, . . . , Ce0$k$ coupled to the word line WL0 may form an even physical page, and the odd-numbered memory cells Co00, Co01, . . . , Co0$k$ may form an odd physical page. The page (or the even page and the odd page) may be a basic unit for a program operation or a read operation.

Referring back to FIGS. 1 and 2, the operations of the peripheral circuits 120, 130, . . . , 170 may include an operation of precharging a bit line so that a precharge level of the bit line varies depending on whether an adjacent unselected memory cell, which is adjacent to a selected memory cell, is in the program state or the erase state by supplying a first voltage (hereinafter referred to as a 'first pass voltage Vpass1') to the adjacent unselected memory cell arranged toward the drain select transistor DST, a second voltage (hereinafter referred to as a 'second pass voltage Vpass2') to the remaining memory cells in order to turn on the remaining memory cells, and a third voltage (hereinafter referred to as a 'second precharge voltage') higher than a bit line precharge voltage (hereinafter referred to as a 'first precharge voltage') to the common source line CSL. The operations of the peripheral circuits 120, 130, . . . , 170 may include a read operation of supplying a read voltage Vread lower than the second voltage to the selected memory cell, the second pass voltage Vpass2 to the remaining memory cells including the adjacent unselected memory cell, and a ground voltage to the common source line. This is described in detail later.

The peripheral circuits include an operation circuit group, comprising operation circuits 130, 140, . . . , 170, and a control circuit 120 configured to control the operation circuits 130, 140, . . . , 170. The operation circuits may include a voltage generator 130, a row decoder 140, a page buffer group 150, a column selector 160 and an I/O circuit 170.

The control circuit 120 generates internal command signal CMDi for performing a program operation, a read operation, or an erase operation in response to an external command signal CMD received via an I/O circuit 170 and generates PB control signals PB_SIGNALS for controlling the page buffers PB0, PB1, . . . , PBk of the page buffer group 150 depending on a type of an operation. Furthermore, the control circuit 120 generates a row address signal RADD and a column address signal CADD in response to an external address signal ADD received via the I/O circuit 170. The operation of the control circuit 120 will be described in detail later.

The voltage generator 130 generates operating voltages for the program operation, the read operation, and the erase operation on memory cells included in a selected page of the memory cell block 110MB.

In particular, in the operation of precharging a bit line (for example, BLe0) for the read operation, the voltage generator 130 is configured to generate the first precharge voltage and the second precharge voltage higher than the first precharge voltage. The Row decoder 140 and the page buffer group 150 are configured to supply the operating voltages to gates of cell transistors and the string ST in order to latch data stored in a selected memory cell (for example, Cen-20) of the memory cells Ce00, Ce10, . . . , Cen0 coupled to the bit line BLe0. Also, the page buffer group 150 is configured to sense a shift in the voltage level of the bit line BLe0.

More specifically, for example, in the precharge operation, the operation circuits 130, 140, 150 generate and apply the first pass voltage Vpass1, the second pass voltage Vpass1 higher than the first pass voltage Vpass1, the first precharge voltage (for example, Vcsl), the second precharge voltage, and select voltages Vdsl and Vssl. The first pass voltage Vpass1 is applied to a first unselected memory cell Cen-10 through the word line WLn-1 so that a precharge level of the bit line varies depending on whether the first unselected memory cell Cen-10, adjacent to the selected memory cell Cen-20 and arranged toward the drain select transistor DST, is in the program state or the erase state. Here, the first unselected memory cell Cen-10 is coupled to the drain of the selected memory cell Cen-20. The second pass voltage Vpass2 is applied to the selected memory cell Cen-20 and second unselected memory cells Ce00, Ce10, . . . , Cen-30 and Cen0 in order to turn on the remaining second unselected memory cells Ce00, Ce10, . . . , Cen-30 and Cen0. The select voltages Vdsl and Vssl are applied to the drain and source select transistors DST and SST in order to turn on the drain and source select transistors DST and SST.

If the first unselected memory cell Cen-10 is in the program state, the bit line BLe0 is precharged up to the first precharge voltage. Furthermore, when the first unselected memory cell Cen-10 is in the erase state, the bit line BLe0 is precharged up to the second precharge voltage Vcsl because the second precharge voltage Vcsl the common source line CSL has been received is transferred to the bit line BLe0 through the string ST.

Next, in an operation of latching data stored in the selected memory cell Cen-20, the second pass voltage Vpass2, outputted to the word line WLn-2 coupled to the selected memory cell Cen-20, is changed into the read voltage Vread and the first pass voltage Vpass1, applied to the first unselected memory cell Cen-10, is changed into the second pass voltage Vpass2.

Here, the operation circuits 130, 140, . . . , 170 may perform above operations.

A voltage supply circuit such as the voltage generator 130 and the row decoder 140 generates the operating voltages Vread, Vpass1, Vpass2, Vdsl, Vssl, and the second precharge voltage Vcsl in the read operation. Also, the voltage supply circuit (e.g., 130 and 140) outputs the operating voltages Vread, Vpass1, Vpass2, Vdsl, Vssl, and Vcsl for the read operation of memory cells to local lines, including the drain select line DSL, the word lines WL0, WL1, ..., WLn, and the source select line SSL of the memory cell block 100MB, in response to the internal command signal CMDi of the control circuit 120 and outputs the common source voltage, also used as the second precharge voltage Vcsl, to the common source line CSL.

The voltage supply circuit may include a voltage generator 130 and a row decoder 140.

The voltage generator 130 outputs the operating voltages Vread, Vpass1, Vpass2, Vdsl, Vssl, and Vcsl for the read operation of the memory cells to global lines in response to the internal command signal CMDi.

The row decoder 140 couples the global lines and the local lines DSL, WL0 to WLn, and SSL in response to the row address signals RADD so that the operating voltages outputted from the voltage generator 130 to the global lines can be transferred to the local lines DSL, WL0, WL1, ..., WLn, and SSL of the memory cell block 110MB of the memory array 110. Accordingly, the second pass voltage Vpass2 or the read voltage Vread outputted from the voltage generator 130 to the global word line is applied to the local word line WLn-2 coupled to the selected memory cell Cen-20 via the row decoder 140. Furthermore, the first and second pass voltages Vpass1 and Vpass2 outputted from the voltage generator 130 to the global word lines are selectively applied to the local word lines WL0, WL1, ..., WLn-3, WLn-1, and WLn coupled to the unselected memory cells Ce00, Ce10, ..., Cen-30, Cen-10, and Cen0, respectively, via the row decoder 140.

The page buffer groups 150 includes the plurality of page buffers PB0, PB1, ..., PBk coupled to the memory array 110 through the bit lines BLe0, BLe1, ..., BLek and BLo0 to BLok, respectively. The page buffers PB0, PB1, ..., PBk generate the second precharge voltage for precharging the bit lines BLe0, BLe1, ..., BLek or BLo0, BLo1, ..., BLok in response to the PB control signals PB_SIGNALS, sense a shift in the voltage levels of the precharged bit lines BLe0, BLe1, ..., BLek or BLo0, BLe1, ..., BLok, and latch relevant data in the read operation of reading out data from the memory cells Ce00, Ce01, ..., Ce0$k$ or Co00, Co01, ..., Co0$k$.

Here, the page buffer PB0 outputs the second precharge voltage for precharging the bit line BLe0. As described above, however, the bit line BLe0 is precharged to the second precharge voltage, for example, only when the unselected memory cell Cen-20 is in the program state, and the bit line BLe0 is precharged to the first precharge voltage Vcsl when the unselected memory cell Cen-20 is in the erase state. Thus, the second precharge voltage is not applied to the bit line BLe0.

In the read operation, after the bit line BLe0 is precharged to the first precharge voltage or the second precharge voltage Vcsl, when the read voltage Vread, the second pass voltage Vpass2, and the select voltages Vdsl and Vssl are applied from the voltage supply circuit (e.g., 130 and 140) to the string ST, bit lines coupled to memory cells in which program data is stored maintain a precharge state, and bit lines coupled to memory cells in which erase data is stored are discharged. The page buffer group 150 senses a shift in the voltage levels of the bit lines BLe0, BLe1, ..., BLek and latches the data of memory cells corresponding to the result of the sense. The configuration of the page buffer is described in detail later.

The column selector 160 selects one or more of the page buffers PB0, PB1, ..., PBk from the page buffer group 150 in response to the column address CADD of the control circuit 120. That is, the column selector 160, for example, sequentially transfers data to be stored in memory cells to the page buffers PB0, PB1, ..., PBk in response to the column address CADD. Furthermore, the column selector 160, for example, sequentially selects the page buffers PB0, PB1, ..., PBk in response to the column address CADD so that data stored in memory cells and latched in the page buffers PB0, PB1, ..., PBk can be externally outputted in the read operation.

The I/O circuit 170 transfers external data to the column selector 160 under the control of the control circuit 120 in the program operation so that the external data is inputted to the page buffer group 150 and then stored in memory cells. When the external data is sequentially transferred to the page buffers PB0, PB1, ..., PBk of the page buffer group 150 as described above, the page buffers PB0, PB1, ..., PBk store the external data in their internal latches. Furthermore, in the read operation, the I/O circuit 170 externally outputs data received from the page buffers PB0, PB1, ..., PBk via the column selector 160.

Figure 3:
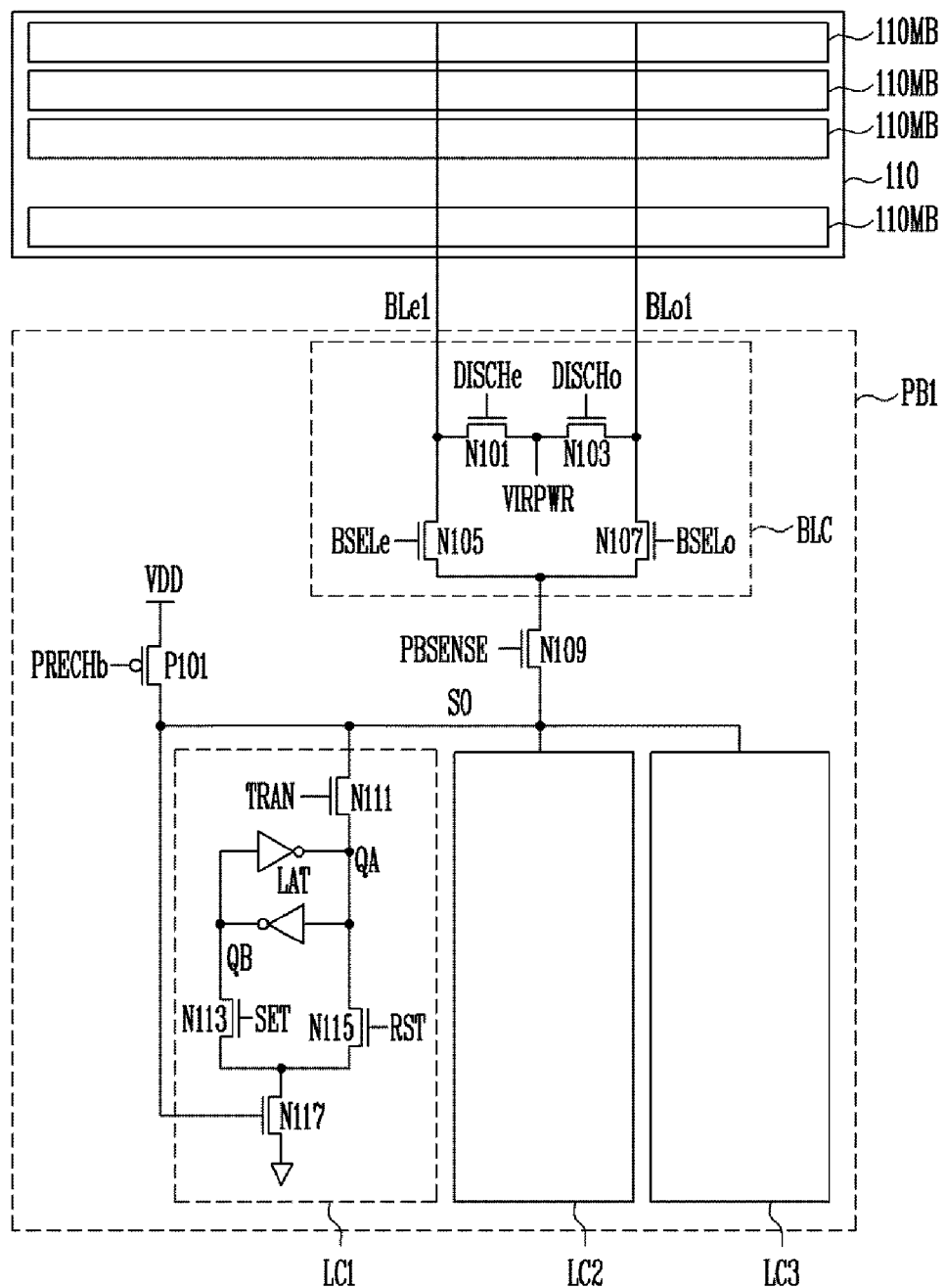
FIG. 3 is a circuit diagram of a page buffer shown in FIG. 1.

FIG. 3 is a circuit diagram of the page buffer shown in FIG. 1.

Referring to FIG. 3, the page buffer (for example, PB1) is operated under the control of the control circuit 120. Signals PRECHb, TRAN, RST, SET, PBSENSE, BSELe, BSELe, DISCHe, and DISCHo to be described later may be generated from the control circuit 120.

The page buffer PB1 includes a bit line select circuit BLC, a precharge circuit P101, a bit line coupling circuit N109, and first to third latch circuits LC1 to LC3.

The switching elements N105 and N107 of the bit line select circuit BLC select one of the even bit line BLe1 and the odd bit line BLo1 in response to bit line select signals BSELe and BSELe, respectively. The switching elements N101 and N103 of the bit line select circuit BLC may precharge an unselected bit line in the program operation or discharge an unselected bit line in the read operation, in response to discharge signals DISCHe and DISCHo, respectively. In the bit line select circuit BLC, for example, a pair of bit lines including an even bit line and an odd bit line may be coupled to a page buffer. In case of an all-bit line (ABL) method in which one page buffer is coupled to one bit line, the bit line select circuit BLC may be omitted.

The bit line coupling circuit N109 is coupled to the first to third latch circuits LC1 to LC3, and may couple the selected bit line to the latch circuits in response to a bit line coupling signal PBSENSE. The first to third latch circuits LC1 to LC3 are coupled in parallel to the bit line coupling circuit N109, and a node connected to the bit line coupling circuit N109 and the first to third latch circuits LC1 to LC3 become a sense node SO.

The precharge circuit P101 precharges the sense node SO in response to a precharge signal PRECHB. Voltage for precharging the sense node SO is used as the first precharge voltage for precharging a bit line. That is, the precharge circuit P101 generates the first precharge voltage for precharging a bit line.

It is to be noted that the number of latch circuits LC1 to LC3 is illustrated as being 3, but may be changed according to a design. For example, only one of the first to third latch circuits LC1 to LC3 is enabled. According to an example, in the program operation, the first latch circuit LC1 may temporarily store data received via the column selector 160 and transfer the data to the second latch circuit LC2. Also, in the read operation, the first latch circuit LC1 may temporarily store data read out from a memory cell before outputting the read data to the column selector 160. The second latch circuit LC2 may supply a program inhibition voltage or a program permission voltage to the bit line BLe1 or BLo1 in the program operation based on the data received from the first latch circuit LC1. Furthermore, the second latch circuit LC2 may temporarily store data stored in a memory cell according to a voltage of the bit line BLe1 or BLo1 and transfer the stored data to the first latch circuit LC1 in the read operation. In a verify operation subsequent to the program operation, the third latch circuit LC3 may latch data in accordance with a result of comparison between the threshold voltage of a memory cell and a target voltage.

The first to third latch circuits LC1 to LC3 may have the same configuration. Thus, only the first latch circuit LC1 is described as an example, for simplicity.

The first latch circuit LC1 includes a latch LAT configured to latch data, a switching element N111 configured to couple the non-inverting terminal QA of the latch LAT to the sense node SO in response to a transfer signal TRAN, switching elements N113 and N115 coupled to the inverting terminal QB and the non-inverting terminal QA of the latch LAT, respectively, and a switching element N117 coupled between the switching elements N113 and N115 and a ground terminal. Here, the switching elements N113 and N115 are operated in response to a set signal SET and a reset signal RST, respectively, and the switching element N117 is operated according to voltage of the sense node SO. For reference, the column selector 160 (see FIG. 1) is coupled to the sense node SO of the page buffer PB1 through the non-inverting terminal QA and the inverting terminal QB of the latch LAT in response to the column select signal CS[k:1].

Signals of different waveforms are inputted to the second and the third latch circuits LC2 and LC3. Thus, only one of the first to third latches LC1 to LC3 may be enabled or the first to third latches LC1 to LC3 may perform different functions although they have the same configuration.

A method of operating the semiconductor memory device is described below.

Figure 4A:
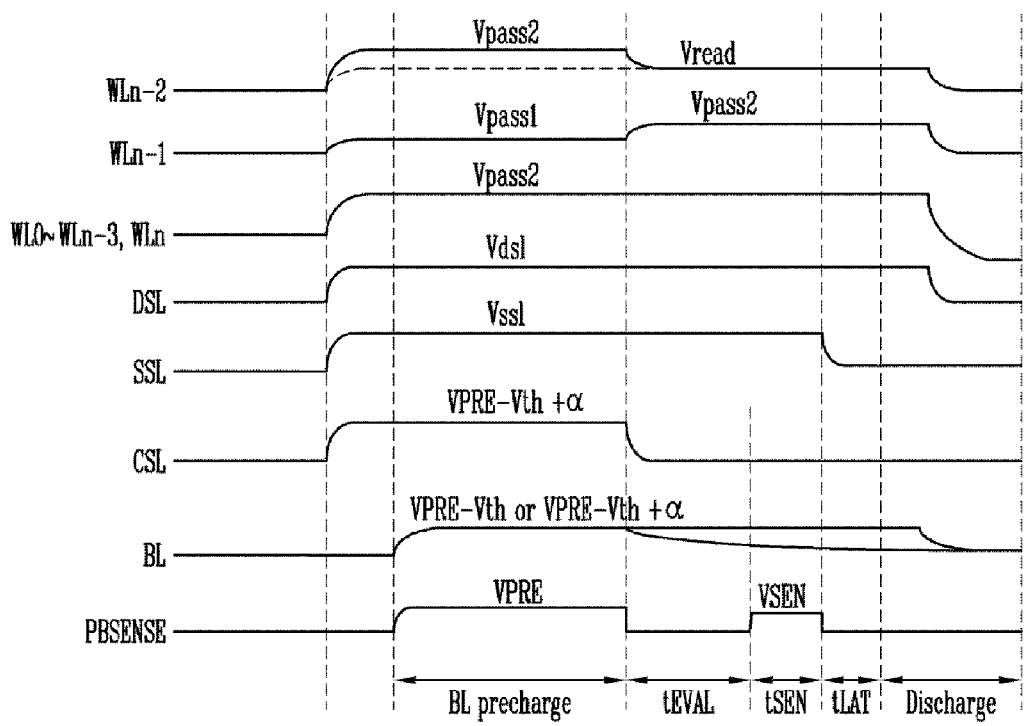
FIGS. 4A and 4B are waveforms illustrating a method of operating the semiconductor memory device according to an exemplary embodiment of the present invention.
Figure 4B:
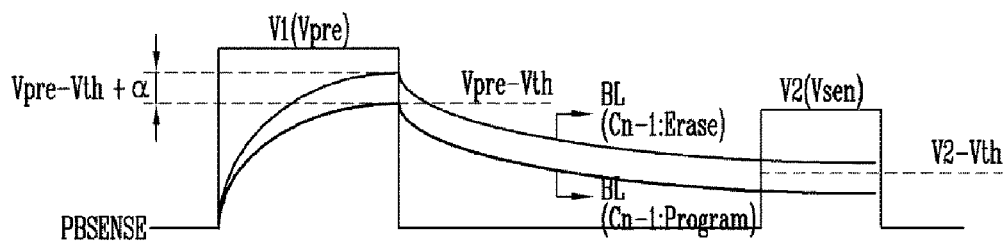
Figure 5A:
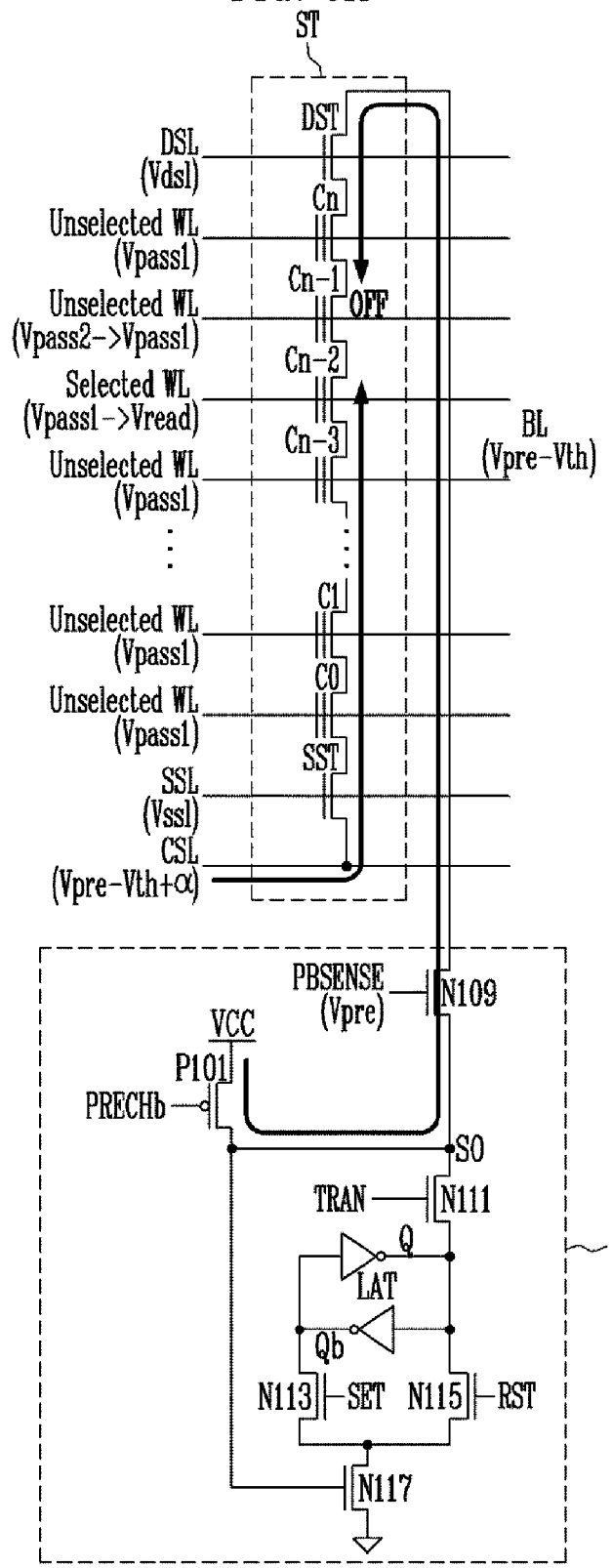
FIGS. 5A and 5B are circuit diagrams illustrating a method of operating the semiconductor memory device according to an exemplary embodiment of the present invention.
Figure 5B:
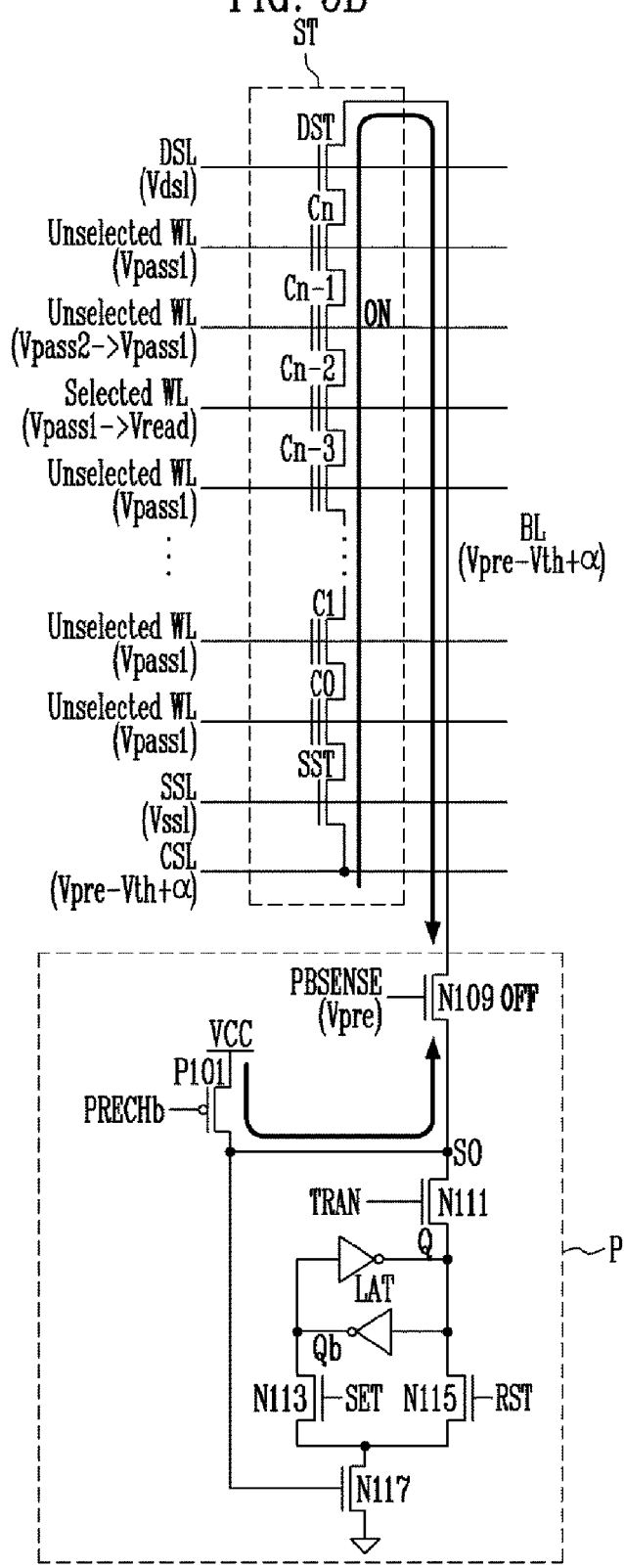

FIGS. 4A and 4B are waveforms illustrating a method of operating the semiconductor memory device according to an exemplary embodiment of the present invention. FIGS. 5A and 5B are circuit diagrams illustrating a method of operating the semiconductor memory device according to an exemplary embodiment of the present invention.

Referring to FIGS. 4A and 5A, the operation of the semiconductor memory device according to an exemplary embodiment of the present invention includes the operation of precharging a bit line and the read operation of latching data of a selected memory cell.

In the operation of precharging a bit line, a precharge level of the bit line varies depending on whether an adjacent unselected memory cell, which is adjacent to a selected memory cell, is in the program state or the erase state by supplying the first pass voltage Vpass1 to the adjacent unselected memory cell arranged toward the drain select transistor DST, the second voltage to the remaining memory cells in order to turn on the remaining memory cells, and the second precharge voltage, higher than the first precharge voltage, to the common source line CSL. In the read operation, the read voltage Vread lower than the second voltage is applied to the selected memory cell, the second pass voltage Vpass2 is applied to the remaining memory cells including the adjacent unselected memory cell, and the ground voltage is applied to the common source line CSL. This is described in detail below.

Referring to FIGS. 4A and 5A, in a BL precharge section, when a first unselected memory cell Cn-1 coupled to the drain of a memory cell (for example, Cn-2) selected from among the memory cells of a string ST coupled between the bit line BL and the common source line CSL is in the program state, the bit line BL is precharged to a first level (Vpre−Vth). When the first unselected memory cell Cn-1 is in the erase state, the bit line BL is precharged to a second level (Vpre−Vth+a) higher than the first level (Vpre−Vth).

More specifically, the first pass voltage Vpass1 of about 1 V is applied to the first unselected memory cell Cn-1 so that a precharge level of the bit line varies depending on whether the first unselected memory cell Cn-1 is in the program state or an erase state. The second pass voltage Vpass2 is applied to the selected memory cell Cn-2 and second unselected memory cells C0, C1, . . . , Cn-3 and Cn in order to turn on the second unselected memory cells C0, C1, . . . , Cn-3 and Cn. Furthermore, the select voltages Vdsl and Vssl are applied to the drain select transistor DST of the string ST coupled to the bit line BL and the source select transistor SST of the string ST coupled to the common source line CSL, respectively, in order to turn on the drain select transistor DST and the source select transistor SST.

In particular, the page buffer PB outputs the first precharge voltage of the first level (Vpre−Vth), and the second precharge voltage of the second level (Vpre−Vth+a) which is higher than the first level (Vpre−Vth) is applied to the common source line CSL.

In this state, since the first pass voltage Vpass1 is applied to the first unselected memory cell Cn-1, the first unselected memory cell Cn-1 is turned off when the first unselected memory cell Cn-1 is in the program state. Thus, although the selected memory cell Cn-2 and the second unselected memory cells C0, C1, . . . , Cn-3 and Cn are turned on by the second pass voltage Vpass2, the second precharge voltage applied to the common source line CSL is not transferred to the bit line BL because the first unselected memory cell Cn-1 is turned off.

Accordingly, the bit line BL is precharged to the first precharge voltage of the first level (Vpre−Vth) outputted from the precharge circuit P101 of the page buffer PB.

Referring to FIGS. 4A and 5B, when the first unselected memory cell Cn-1 is in an erase state and the first pass voltage Vpass1 is applied to the first unselected memory cell Cn-1, the first unselected memory cell Cn-1 is turned on. Thus, the second precharge voltage of the second level (Vpre−Vth+a) applied to the common source line CSL is transferred to the bit line BL through the string ST including the turned-on drain and source select transistors DST and SST and the turned-on memory cells C0, C1, . . . , Cn because the selected memory cell Cn-2 and the second unselected memory cells C0, C1, . . . , Cn-3 and Cn are also turned on by the second pass voltage Vpass2. Accordingly, the bit line BL is precharged to the second precharge voltage of the second level (Vpre−Vth+a) applied to the common source line CSL.

Next, the voltage Vpre applied to the gate of the bit line coupling circuit N109, the voltage (Vpre−Vth+a) of the bit line BL, and voltage applied from the precharge circuit P101 become turn-off condition, and the bit line coupling circuit N109 for coupling the bit line BL and the precharge circuit P101 of the page buffer PB is turned off. Accordingly, the first precharge voltage generated from the page buffer PB is not transferred to the bit line BL.

As a result, the precharge level of the bit line BL varies depending on whether the first unselected memory cell Cn-1 is in the program state or the erase state. Furthermore, the precharge levels of the bit lines BLe0, BLe1, . . . , BLek or BLo0, BLo1, . . . , BLok (see FIG. 2) may have the first level or the second level depending on whether the first unselected memory cells Cen-10, Cen-11, . . . , Cen-1k coupled to the drains of the selected memory cells Cen-20, Cen-21, . . . , Cen-2k (see FIG. 2).

After the bit line BL is precharged, the read operation, including an evaluation section tEVAL, a sense section tSEN, a data latch section tLAT, and a discharge section, is performed.

In the evaluation section tEVAL, the second pass voltage Vpass2 applied to the word line WLn-2 (that is, the selected memory cell Cn-2) shifts to the read voltage Vread, and the first pass voltage Vpass1 applied to the word line WLn-1 (that is, the first unselected memory cell Cn-1) shifts to the second pass voltage Vpass2. The second pass voltage Vpass2 continues to be applied to the remaining second unselected memory cells C0, C1, . . . , Cn-3 and Cn coupled to the word lines WL0, WL1, . . . , WLn-3 and WLn, respectively. When the selected memory cell Cn-2 is in the program state, a voltage level precharged by the bit line BL is maintained. When the selected memory cell Cn-2 is in the erase state, voltage precharged by the bit line BL is discharged.

In the sense section tSEN, a sense voltage VSEN is applied to the switching element N111 of the page buffer PB. Thus, if the switching element N111 is in the turn-on condition depending on a relationship between voltage of the bit line BL, voltage of the sense node SO, and the sense voltage VSEN, the bit line BL and the sense node SO of the page buffer PB are electrically coupled by the switching element N111. If not, the bit line BL and the sense node SO of the page buffer PB are electrically isolated by the switching element N111. In other words, if the selected memory cell Cn-2 is in the erase state, the bit line BL is discharged and the switching element N111 becomes turn-on condition. Accordingly, the bit line BL and the sense node SO of the page buffer PB are coupled, and consequently voltage of the sense node SO is also lowered. If the selected memory cell Cn-2 is in the program state, however, the bit line BL maintains a precharge state and the switching element N111 is in the turn-off condition. Accordingly, the bit line BL and the sense node SO of the page buffer PB may be electrically isolated, and consequently the sense node SO maintains a precharge state by the precharge circuit P101.

In the data latch section tLAT, when the sense node SO is discharged, the switching element N117 is turned off and initial data latched in the latch LAT in maintained. If the sense node SO maintains a precharge state, however, the switching element N117 is turned on and initial data latched in the latch LAT is reversed. Thus, data stored in the selected memory cell Cn-2 is latched in the latch LAT.

Next, in the discharge section, all the voltages are discharged.

The threshold voltage of a memory cell is shifted depending on a precharge level of the bit line BL. This is described in detail below.

Referring to FIGS. 4B, 5A, and 5B, in the BL precharge section, when the first unselected memory cell Cn-1 is in the program state, the bit line BL is precharged up to the first level (Vpre−Vth). When the first unselected memory cell Cn-1 is in the erase state, the bit line BL is precharged up to the second level (Vpre−Vth+a).

Next, in the evaluation section tEVAL where the read voltage Vread is applied, when the threshold voltage of the selected memory cell Cn-2 is lower than the read voltage Vread, voltage of the bit line BL is discharged. When the threshold voltage of the selected memory cell Cn-2 is higher than the read voltage Vread, the voltage level of the bit line BL is maintained. There is no difference when the threshold voltage of the selected memory cell Cn-2 is higher than the read voltage Vread. When the threshold voltage of the selected memory cell Cn-2 is lower than the read voltage Vread, however, the threshold voltage of the selected memory cell Cn-2 is sensed to be different from an actual threshold voltage depending on a precharge level of the bit line BL.

That is, there is a difference 'a' in the precharge level of the bit line BL depending on the program state or the erase state of the first unselected memory cell Cn-1. The difference 'a' exists even after the bit line BL is discharged by the selected memory cell Cn-2 of an erase state. Accordingly, for compensating for the interference, if the bit line BL is precharged to the first level (Vpre−Vth), the bit line BL may be discharged to a level lower than a verify level (V2−Vth). Also, if the bit line BL is precharged to the second level (Vpre−Vth+a), the bit line BL may be discharged to a level higher than the verify level (V2−Vth). As a result, the selected memory cell Cn-2 may be sensed to be a program state or an erase state depending on a precharge level of the bit line BL. That is, if the bit line BL is precharged to a higher level, the threshold voltage of the selected memory cell Cn-2 may be sensed to have a higher level.

For this reason, if the first unselected memory cell Cn-1 is in the program state, the threshold voltage of the selected memory cell Cn-2 has risen because an interference phenomenon has occurred in the selected memory cell Cn-2 in a previous operation of programming the first unselected memory cell Cn-1. In order to offset a threshold voltage change of the selected memory cell due to the interference phenomenon, a sense operation is performed after the bit line BL is precharged to the first level (Vpre−Vth) so that the threshold voltage of the selected memory cell Cn-2 is sensed as having a level relatively lower than an actual level. If the first unselected memory cell Cn-1 is in the erase state, however, the sense operation is performed after the bit line BL is precharged to the second level (Vpre−Vth+a) because an interference phenomenon has not occurred in the selected memory cell Cn-2 in the previous operation of programming the first unselected memory cell Cn-1.

The above-described operation may also be applied to a program verify operation subsequent to a program operation.

Figure 6:
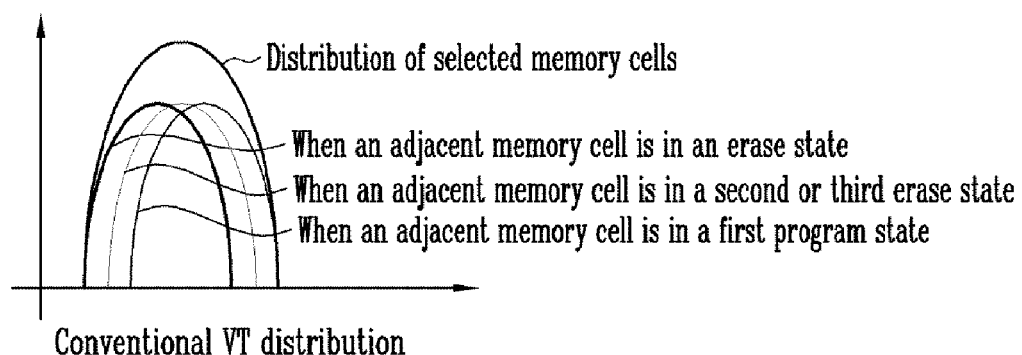
FIG. 6 is a graph illustrating the distributions of the threshold voltages of memory cells.
Figure 6:
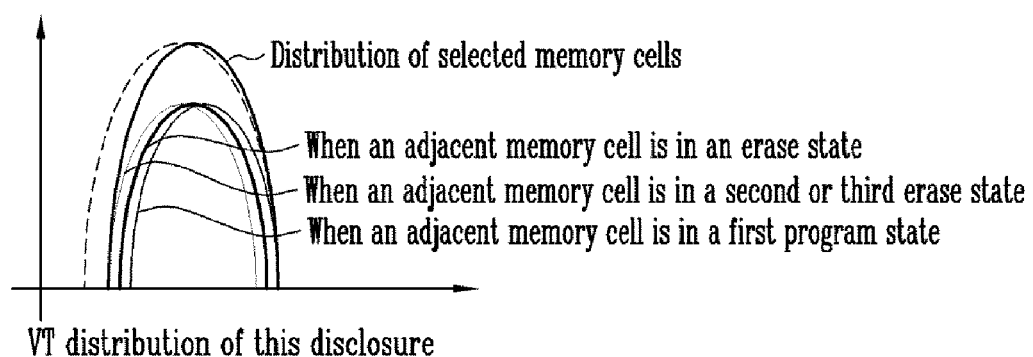

FIG. 6 is a graph illustrating the distributions of the threshold voltages of memory cells.

From FIG. 6, it can be seen that the width of a distribution of the threshold voltages of memory cells is narrower than that of a conventional distribution of the threshold voltages of memory cells by performing a sense operation on the memory cells according to an embodiment of the present invention.

In accordance with an embodiment of the present invention, although the threshold voltage of a memory cell is shifted by a program interference phenomenon occurring when a program operation is performed on an adjacent memory cell, data is outputted while compensating for the threshold voltage of the memory cell. Accordingly, reliability of an operation can be improved.

What is claimed is:

1. A semiconductor memory device, comprising:
a plurality of strings each configured to comprise a drain select transistor, memory cells, and a source select transistor coupled in series between a bit line and a common source line; and
peripheral circuits configured to perform an operation of precharging a bit line so that a precharge level of the bit line varies depending on whether an adjacent unselected memory cell, which is adjacent to a selected memory cell, is in the program state or the erase state, by supplying a first voltage to the adjacent unselected memory cell arranged toward the drain select transistor, a second voltage to remaining memory cells in order to turn on the remaining memory cells, and a third voltage higher than a bit line precharge voltage to the common source line and perform a read operation of supplying a read voltage lower than the second voltage to the selected memory cell, the second voltage to the remaining memory cells including the adjacent unselected memory cell, and a ground voltage to the common source line.

2. The semiconductor memory device of claim 1, wherein the peripheral circuits comprise:
an operation circuit group configured to generate the bit line precharge voltage and the first to third voltages in the operation of precharging the bit line, supply operating voltages, including the read voltage and the second voltage, to the string, and sense a shift in a voltage level of the bit line in the read operation; and
a control circuit configured to control the operation circuit group in order to precharge the bit line so that the level of the bit line becomes the third voltage when the adjacent unselected memory cell is in the erase state and the level of the bit line becomes the bit line precharge voltage when the adjacent unselected memory cell is in the program state.

3. The semiconductor memory device of claim 2, wherein the operation circuit group supplies select voltages for turning on the drain select transistor and the source select transistor to the string in the operation of precharging the bit line.

4. The semiconductor memory device of claim 3, wherein the operation circuit group outputs the bit line precharge voltage to the bit line so that the bit line is precharged to the bit line precharge voltage, when the adjacent unselected memory cell is in the program state in the operation of precharging the bit line.

5. The semiconductor memory device of claim 3, wherein:
the operation circuit group outputs the third voltage to the common source line, and
the bit line is precharged to the third voltage transferred through the string when the adjacent unselected memory cell is in the erase state in the operation of precharging the bit line.

6. The semiconductor memory device of claim 3, wherein in order to latch data stored in the selected memory cell, the operation circuit group lowers the second voltage, applied to the selected memory cell, to the read voltage and raises the first voltage, applied to the adjacent unselected memory cell, to the second voltage.

7. The semiconductor memory device of claim 2, wherein the operation circuit group comprises:
a voltage supply circuit configured to output the operating voltages and the third voltage; and
a page buffer coupled to the bit line and configured to sense the shift in the voltage level of the bit line in order to output the bit line precharge voltage or latch the data in the operation of precharging the bit line.

8. The semiconductor memory device of claim 7, wherein the operating voltages comprise select voltages applied to the drain select transistor and the source select transistor, the read voltage applied to the memory cells, the first voltage, and the second voltage higher than the first voltage.

9. The semiconductor memory device of claim 7, wherein the voltage supply circuit supplies the operating voltages, including the first voltage and the second voltage, to the string in the operation of precharging the bit line, and wherein the first voltage is applied so that the precharge level of the bit line varies depending on whether the adjacent unselected memory cell is in the program state or the erase state, and the second voltage is applied for turning on the selected memory cell and the remaining memory cells.

10. The semiconductor memory device of claim 9, wherein the voltage supply circuit outputs the third voltage to the common source line.

11. The semiconductor memory device of claim 9, wherein the voltage supply circuit supplies the operating voltages, including select voltages for turning on the drain select transistor and the source select transistor, to the string in the operation of precharging the bit line.

12. The semiconductor memory device of claim 9, wherein in order to latch data stored in the selected memory cell, the voltage supply circuit changes the second voltage, applied to the selected memory cell, into the read voltage and changes the first voltage, applied to the adjacent unselected memory cell, into the second voltage.

13. A method of operating a semiconductor memory device, comprising:
performing an operation of precharging a bit line so that a precharge level of the bit line varies depending on whether an adjacent unselected memory cell, which is adjacent to a selected memory cell, is in the program state or the erase state, by supplying a first voltage to the adjacent unselected memory cell arranged toward a drain select transistor, a second voltage to remaining memory cells including the selected memory cell in order to turn on the remaining memory cells, and a third voltage higher than a bit line precharge voltage to a common source line; and
performing a read operation of supplying a read voltage lower than the second voltage to the selected memory cell, the second voltage to the remaining memory cells including the adjacent unselected memory cell, and a ground voltage to the common source line.

14. The method of claim 13, wherein performing an operation of precharging a bit line comprises precharging the bit line so that the level of the bit line becomes the bit line precharge voltage when the adjacent unselected memory cell is in the program state and the level of the bit line becomes the third voltage when the adjacent unselected memory cell is in the erase state.

15. The method of claim 14, wherein when the adjacent unselected memory cell is in the program state, the bit line is precharged to the bit line precharge voltage outputted from a page buffer coupled to the bit line.

16. The method of claim 14, wherein when the adjacent unselected memory cell is in the erase state, the third voltage applied to the common source line is transferred to the bit line through the memory cells, and the bit line is precharged to the third voltage.

17. The method of claim 15, wherein performing an operation of precharging a bit line comprises supplying the first voltage to the adjacent unselected memory cell so that the precharge level of the bit line varies depending on whether the adjacent unselected memory cell is in the program state or the erase state and supplying the second voltage for turning on the selected memory cell and the remaining memory cells.

18. The method of claim 16, wherein performing an operation of precharging a bit line comprises supplying the first voltage to the adjacent unselected memory cell so that the precharge level of the bit line varies depending on whether the adjacent unselected memory cell is in the program state or the erase state and supplying the second voltage for turning on the selected memory cell and the remaining memory cells.

19. The method of claim 17, wherein performing an operation of precharging a bit line comprises supplying select voltages to the drain select transistor and the source select transistor for turning on the drain select transistor of a string coupled to the bit line and the source select transistor of the string coupled to the common source line.

20. The method of claim 18, wherein performing an operation of precharging a bit line comprises supplying select voltages to the drain select transistor and the source select transistor for turning on the drain select transistor of a string coupled to the bit line and the source select transistor of the string coupled to the common source line.

* * * * *